(12) United States Patent
Lee et al.

(10) Patent No.: US 10,506,739 B2
(45) Date of Patent: Dec. 10, 2019

(54) LAPTOP COMPUTER

(71) Applicants: Shang-Che Lee, Taipei (TW); I-Lung Chen, Taipei (TW); Yi-Hsuan Wu, Taipei (TW); Wang-Hung Yeh, Taipei (TW); Chang-Yuan Wu, Taipei (TW); Jie-Ting Hsieh, Taipei (TW); Yu-Fan Chuang, Taipei (TW)

(72) Inventors: Shang-Che Lee, Taipei (TW); I-Lung Chen, Taipei (TW); Yi-Hsuan Wu, Taipei (TW); Wang-Hung Yeh, Taipei (TW); Chang-Yuan Wu, Taipei (TW); Jie-Ting Hsieh, Taipei (TW); Yu-Fan Chuang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/233,111

(22) Filed: Dec. 27, 2018

(65) Prior Publication Data
US 2019/0208662 A1    Jul. 4, 2019

Related U.S. Application Data

(60) Provisional application No. 62/610,944, filed on Dec. 28, 2017.

(51) Int. Cl.
*H05K 7/20*    (2006.01)
*G06F 1/16*    (2006.01)
(Continued)

(52) U.S. Cl.
CPC ....... *H05K 7/20154* (2013.01); *G06F 1/1624* (2013.01); *G06F 1/1669* (2013.01);
(Continued)

(58) Field of Classification Search
CPC .......... G06F 3/013; G06F 1/163; G06F 3/017; G06F 3/011; G06F 3/005; G06F 1/1616;
(Continued)

(56) References Cited

U.S. PATENT DOCUMENTS 6,078,495 A * 6/2000 Cipolla ................... G06F 1/203
361/679.46
6,599,090 B2 * 7/2003 Ozaki ...................... G06F 1/203
361/679.21
(Continued)

FOREIGN PATENT DOCUMENTS

TW    201223418    6/2012
TW    I512432      12/2015

OTHER PUBLICATIONS

"Office Action of Taiwan Counterpart Application," dated Sep. 9, 2019, pp. 1-6.

*Primary Examiner* — Adam B Dravininkas
(74) *Attorney, Agent, or Firm* — JCIPRNET

(57) ABSTRACT

A laptop computer including a main body, a fan disposed in a receiving space of the main body, a keyboard assembly movably disposed on the main body, and a heat dissipation assembly movably disposed in the main body and linked with the keyboard assembly is provided. The main body has an air outlet and at least one first air inlet. In a process of the keyboard assembly gradually moving out of the main body, the keyboard assembly drives the heat dissipation assembly to move in the main body and form a second air inlet in the main body to communicate with the receiving space.

16 Claims, 12 Drawing Sheets

(51) Int. Cl.
*H05K 5/02* (2006.01)
*G06F 1/20* (2006.01)

(52) U.S. Cl.
CPC .............. *G06F 1/20* (2013.01); *H05K 5/0221* (2013.01); *H05K 7/20509* (2013.01)

(58) Field of Classification Search
CPC ........ G06F 1/203; G06F 1/1656; G06F 3/016; G06F 3/0414; G06F 1/1662; G06F 1/1681; G06F 1/1643; G06F 3/04815; G06F 1/20; G06F 1/1647; G06F 3/044; G06F 3/04886; G06F 1/1637; G06F 1/183; G06F 2203/04104; G06F 2203/04105; G06F 2203/04808; G06F 3/041; G06F 3/0412; G06F 3/0416; G06F 3/045; G06F 3/048; G06F 3/04817; H01L 23/427; H01L 23/367; F28D 15/02; F28D 15/0275; H05K 7/20336; F28F 3/02
See application file for complete search history.

(56) References Cited

U.S. PATENT DOCUMENTS

| | | | |
|---|---|---|---|
| 8,542,486 B2* | 9/2013 | Lin .......................... | G06F 1/203 174/547 |
| 2010/0165567 A1* | 7/2010 | Shih ...................... | G06F 1/1616 361/679.48 |
| 2010/0214743 A1* | 8/2010 | Huang .................. | G06F 1/1616 361/692 |

* cited by examiner

LAPTOP COMPUTER

CROSS REFERENCE TO RELATED APPLICATION

This application claims the priority benefit of U.S. provisional application Ser. No. 62/610,944, filed on Dec. 28, 2017. The entirety of the above-mentioned patent application is hereby incorporated by reference herein and made a part of specification.

BACKGROUND

Technical Field

The disclosure relates to a laptop computer.

Description of Related Art

In recent years, the market share of laptop computers keeps increasing and the laptop computers has a trend to replace desktop computers. Compared to a desk top computer, a laptop computer has advantages of smaller size, lower electricity consumption, and easy portability, and therefore meets the requirement of the people nowadays for a computer. Generally, under a design concept of a traditional laptop computer, an input interface of the laptop computer, such as a keyboard or a touch pad, is still disposed to be fixed to a host of a computer; thus, a user would operate the laptop computer by putting wrists on the host, which would cause discomfort to the wrists of the user in a long time period.

Moreover, with the development of the electronic sports industry, the requirement of a gamer to a laptop computer for electronic sports is also increasingly higher. However, if the abovementioned fixed type input interface is adopted, the user would not be able to adjust the input interface to the best position according to his or her own requirement, and therefore the operation experience or even the contest performance of the user is likely to be affected. In addition, the abovementioned laptop computer for electronic sports generates heat along with the increasing effects of electronic components. Therefore, how to provide a sufficient effect of heat dissipation under the precondition of a high efficiency performance to keep the efficiency is also cared by gamers as well.

Based on the above, how to make the laptop computer meet the requirements of input interface, efficiency surface and the effects of heat dissipation becomes a task that persons skilled in art need to consider and solve.

SUMMARY

The disclosure provides a laptop computer, which provides additional air inlets to increase the efficiency of heat dissipation by a movable keyboard assembly.

The laptop computer of the disclosure includes a main body, a fan, a keyboard assembly and a heat dissipation assembly. The fan is disposed in a receiving space of the main body, and the main body has an air outlet and at least one first air inlet communicating with the receiving space respectively. The keyboard assembly is movably disposed on the main body. The heat dissipation assembly is movably disposed in the main body and linked with the keyboard assembly. In a process of the keyboard assembly gradually moving out of the main body, the keyboard assembly drives the heat dissipation assembly to move in the main body to form a second air inlet on the main body for communicating with the receiving space. The air of the environment outside the laptop computer is adapted to be drawn by the fan to flow into the receiving space via the second air inlet and the heat dissipation assembly.

In an embodiment of the disclosure, the main body includes a first body and a second body. The fan, the keyboard assembly and the heat dissipation assembly are disposed in the first body, and the second body is pivoted to the first body. When the keyboard assembly gradually moves out of the main body, the keyboard assembly gradually moves away from the second body to form the second air inlet on the first body.

In an embodiment of the disclosure, the second body has a display screen.

In an embodiment of the disclosure, the keyboard assembly is movably disposed on the main body to be transformed between a first state and a second state. In the first state, the keyboard assembly covers the main body and shelters the heat dissipation assembly. In the second state, a portion of the keyboard assembly protrudes out of the main body to form the second air inlet and expose the lifted heat dissipation assembly.

In an embodiment of the disclosure, the keyboard assembly and the heat dissipation assembly are parallel to each other in the first state. In the second state, the heat dissipation assembly is tilted relative to another portion of the keyboard assembly still located on the main body.

In an embodiment of the disclosure, the keyboard assembly includes a keypad portion, a sliding member, an elastic member and a lever. The sliding member is slidably coupled to the main body, and the keypad portion is disposed on the sliding member. The elastic member is connected between the sliding member and the main body. The lever is movably disposed between the keypad portion and the main body. A first end of the lever is exposed out of the keypad portion, and a second end of the lever is located in the main body to buckle or release the sliding member. In the first state, the second end buckles the sliding member and the elastic member is pressed between the sliding member and the main body to accumulate the elastic force. A force from a user is adapted to be applied on the first end, such that the second end is forced to release the sliding member, and the elastic force of the elastic member drives the sliding member and the keypad portion to move on the main body to be transformed to the second state.

In an embodiment of the disclosure, the second end has a non-closed hole or a protruding portion, and the sliding member has a protruding portion or a non-closed hole; in addition, the protruding portion is fitted to the non-closed hole.

In an embodiment of the disclosure, the sliding member has a receiving trough extending toward the fan and an abutting portion located at an end of the receiving trough, and the heat dissipation assembly is freely pivoted to the main body. In the first state, the heat dissipation assembly is located in the receiving trough. In a transforming process from the first state to the second state, the sliding member moves, and the abutting portion moves along an inclined surface of the heat dissipation assembly to push and lift up the heat dissipation assembly.

In an embodiment of the disclosure, the keyboard assembly includes a keypad portion, and a palm rest portion movably connected to the keypad portion. In the first state, the keypad portion and the palm rest portion are both located on the main body and are coplanar. In the second state, the keypad portion is located on the main body, and the palm rest portion is protruded out of the main body to droop opposite to the keypad portion.

In an embodiment of the disclosure, the laptop computer further includes a vibration source disposed in the palm rest portion.

In an embodiment of the disclosure, the palm rest portion has a surface facing away from the main body, and the vibration source is a resonance speaker having an audio output surface facing toward the surface.

In an embodiment of the disclosure, the laptop computer further includes a resonance medium, structurally abutting between the surface and the audio output surface of the resonance speaker.

In an embodiment of the disclosure, the heat dissipation assembly is a cooling member to cool down the air flowing through.

In an embodiment of the disclosure, the heat dissipation assembly includes a plate with multiple openings, and the air of the environment outside the laptop computer flows into the receiving space via the plate and the second air inlet.

In an embodiment of the disclosure, the heat dissipation assembly further includes a plurality of metal pieces disposed on the plate to cool down the air flowing through the plate.

In an embodiment of the disclosure, the heat dissipation assembly further includes a thermoelectric cooling chip disposed on the plate to cool down the air flowing through the plate.

Based on the above, the laptop computer allows the user to adjust the position of the keyboard assembly relative to the main body according to the movable keyboard assembly design; meanwhile, more importantly, the movable heat dissipation assembly is disposed in the main body and linked with the keyboard assembly. Therefore, along with the movement of the keyboard assembly on the main body, the heat dissipation assembly may be driven upward or downward. The heat dissipation assembly may form the additional air inlet on the main body in the lifted state; in addition, the heat dissipation efficiency may be increase because of the heat dissipation assembly cooling down the air flowing through to decrease the temperature of the air flowing into the receiving space.

In order to make the features and advantages of the disclosure mentioned above more understandable, embodiments will be described in detail below with reference to the accompanying drawings.

DESCRIPTION OF THE EMBODIMENTS

Figure 1:
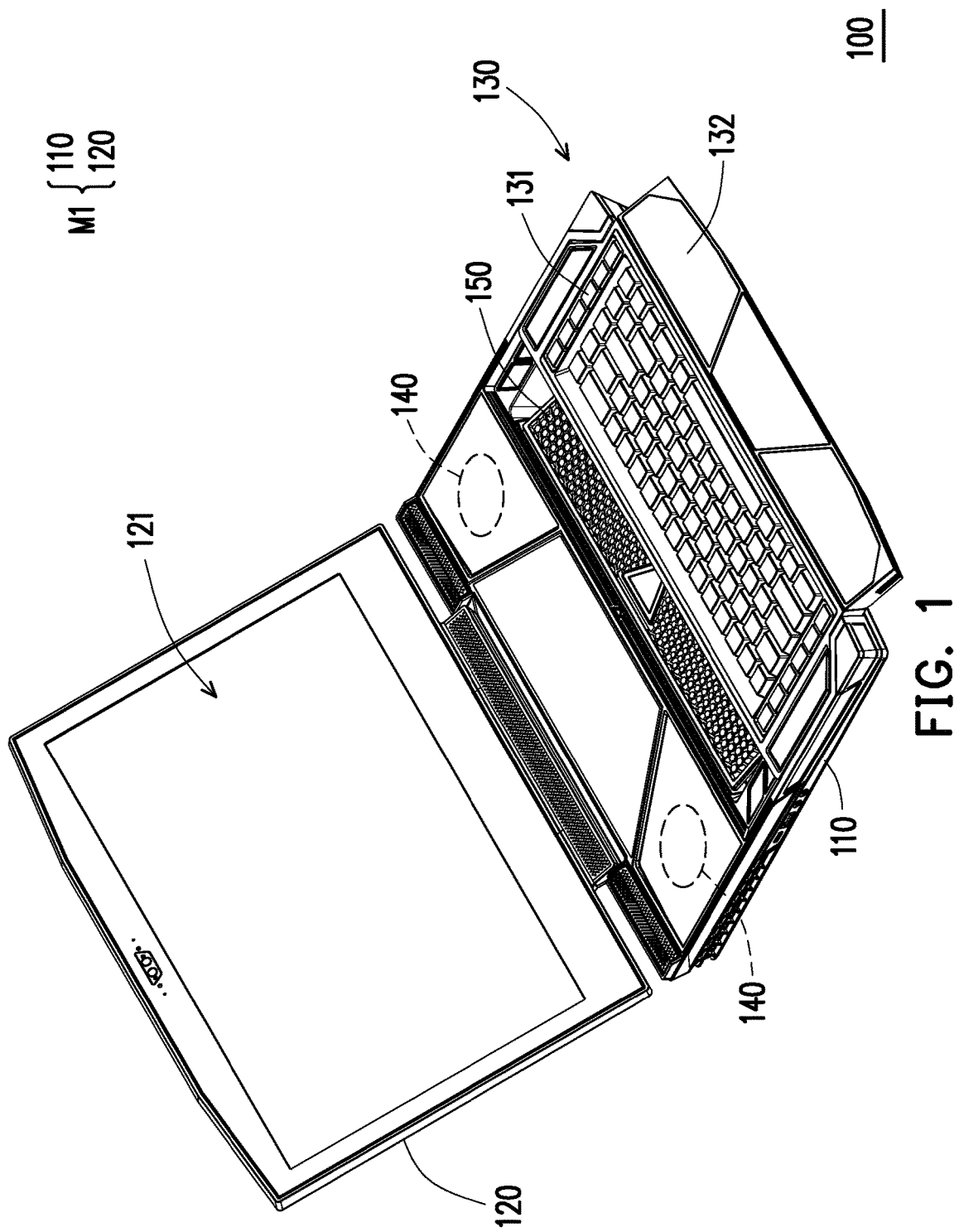
FIG. 1 is a schematic view of a laptop computer according to an embodiment of the disclosure.
Figure 2A:
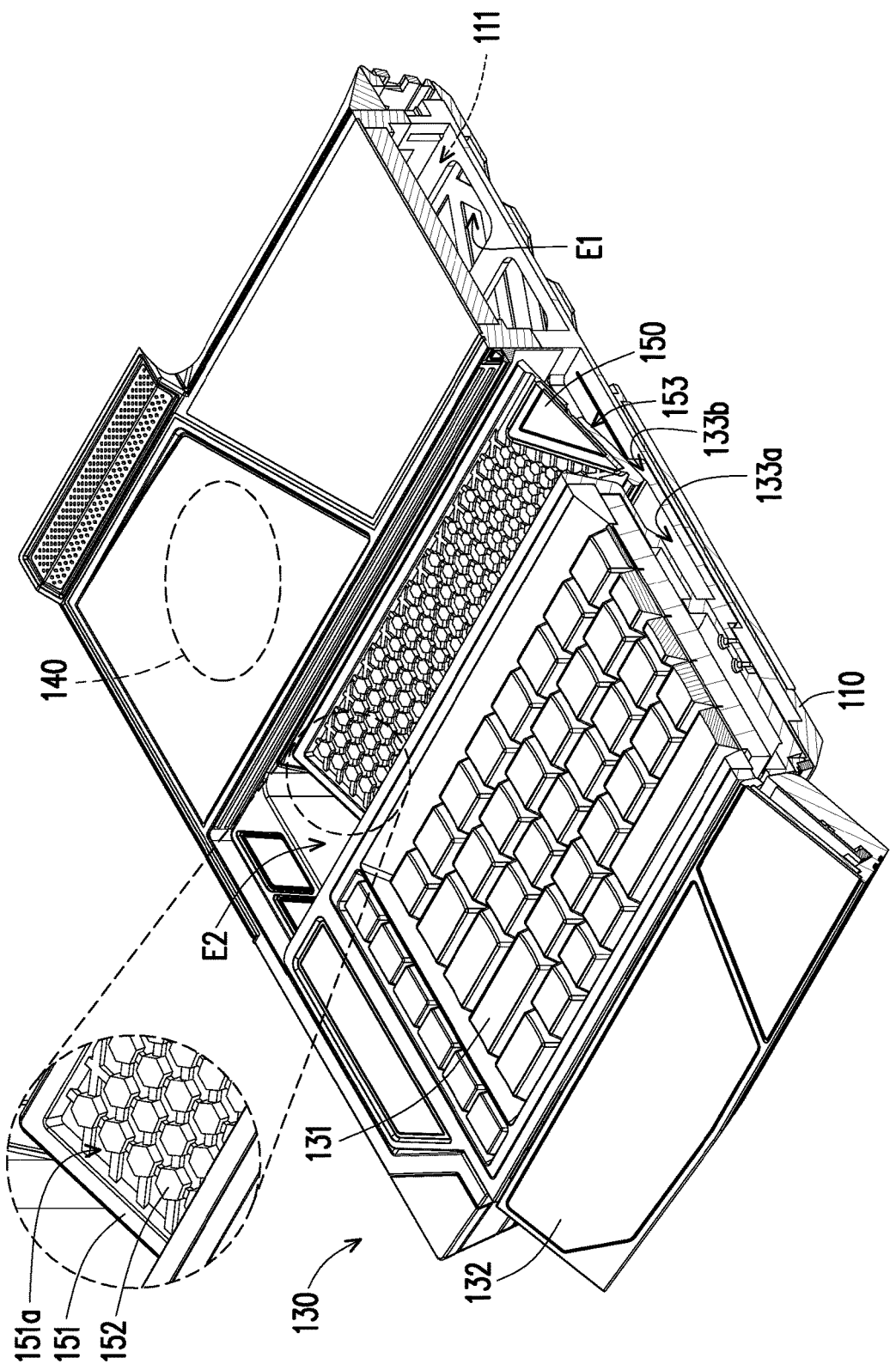
FIG. 2A and FIG. 2B are respectively sectional views of the laptop computer of FIG. 1.
Figure 2B:
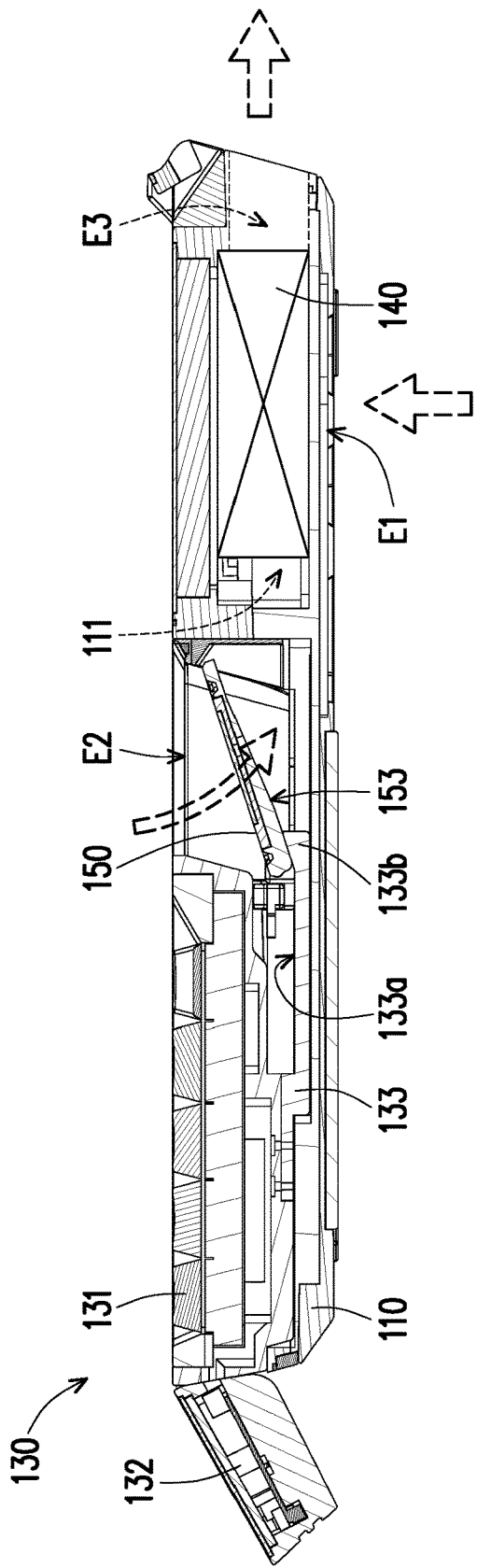

FIG. 1 is a schematic view of a laptop computer according to an embodiment of the disclosure. FIG. 2A and FIG. 2B are respectively sectional views of the laptop computer of FIG. 1. Please refer to FIG. 1, FIG. 2A and FIG. 2B simultaneously, wherein the air flow is represented by dotted arrows. In the present embodiment, a laptop computer 100 includes a main body M1, a fan 140, a keyboard assembly 130 and a heat dissipation assembly 150. The main body M1 includes a first body 110 and a second body 120 pivoted to each other, wherein the fan 140, the keyboard assembly 130 and the heat dissipation assembly 150 are disposed in the first body 110, and the second body 120 has a display screen 121. The fan 140 is disposed in a receiving space 111 of the main body M1 (the first body 110), and the main body M1 (the first body 110) has a first air inlet E1 and an air outlet E3 communicating with the receiving space 111 respectively. Here, the first air inlet E1 is located at the bottom of the first body 110, and the air outlet E3 is located on the back side of the first body 110 (the front side of the laptop computer 100 is specified by a location where a user operating the laptop computer 100); thus, through the airflow effect generated by the fan 140, the air of the environment outside the laptop computer 100 is adapted to be drawn by the fan 140 to flow into the receiving space 111 via the first air inlet E1 and flow out of the main body M1 (the first body 110) via the air outlet E3 so as to achieve the effect of heat dissipation to the electronic components in the laptop computer 110.

Two fans 140 are disposed in the laptop computer 100 as shown by FIG. 1; therefore, the first air inlet E1 as shown by FIG. 2A may be an opening right under the fan 140, or an opening located anywhere under the fan 140. The application is not limited hereto.

Moreover, the keyboard assembly 130 is movably assembled on the first body 110 of the main body M1. The heat dissipation assembly 150 is movably disposed in the first body 110 of the main body M1 and is linked with the keyboard assembly 130, wherein when the keyboard assembly 130 gradually moves out of the main body M1, the keyboard assembly 130 drives the heat dissipation assembly 150 to move in the first body 110 of the main body M1, such that the heat dissipation assembly 150 is lifted up and a second air inlet E2 is formed on the main body M1, wherein the second air inlet E2 communicates with the receiving space 111. Therefore, the air of the environment outside the laptop computer 100 is adapted to be drawn by the fan 140 to flow into the receiving space 111 via the second air inlet E2 and the heat dissipation assembly 150 to perform a heat exchange therein, and then the air flows out of the first body 110 via the air outlet E3. At the same time, it should be noted that the heat dissipation assembly 150 may cool down the air flowing through, and the detailed explanation will be described in the following content. The heat exchange performed in the receiving space 111 here means that, for example, after heat generated from a heat source (such as a display chip or a processor) in the laptop computer 100, the heat is transferred to a heat dissipation fin (now shown) located in the receiving space 111 via a heat pipe, and the fan 140 performs heat dissipation to the fin by drawing the air. However, the disclosure does not limit the means of heat transfer. Any means that perform heat dissipation in a laptop computer may be applicable to the disclosure.

Figure 2C:
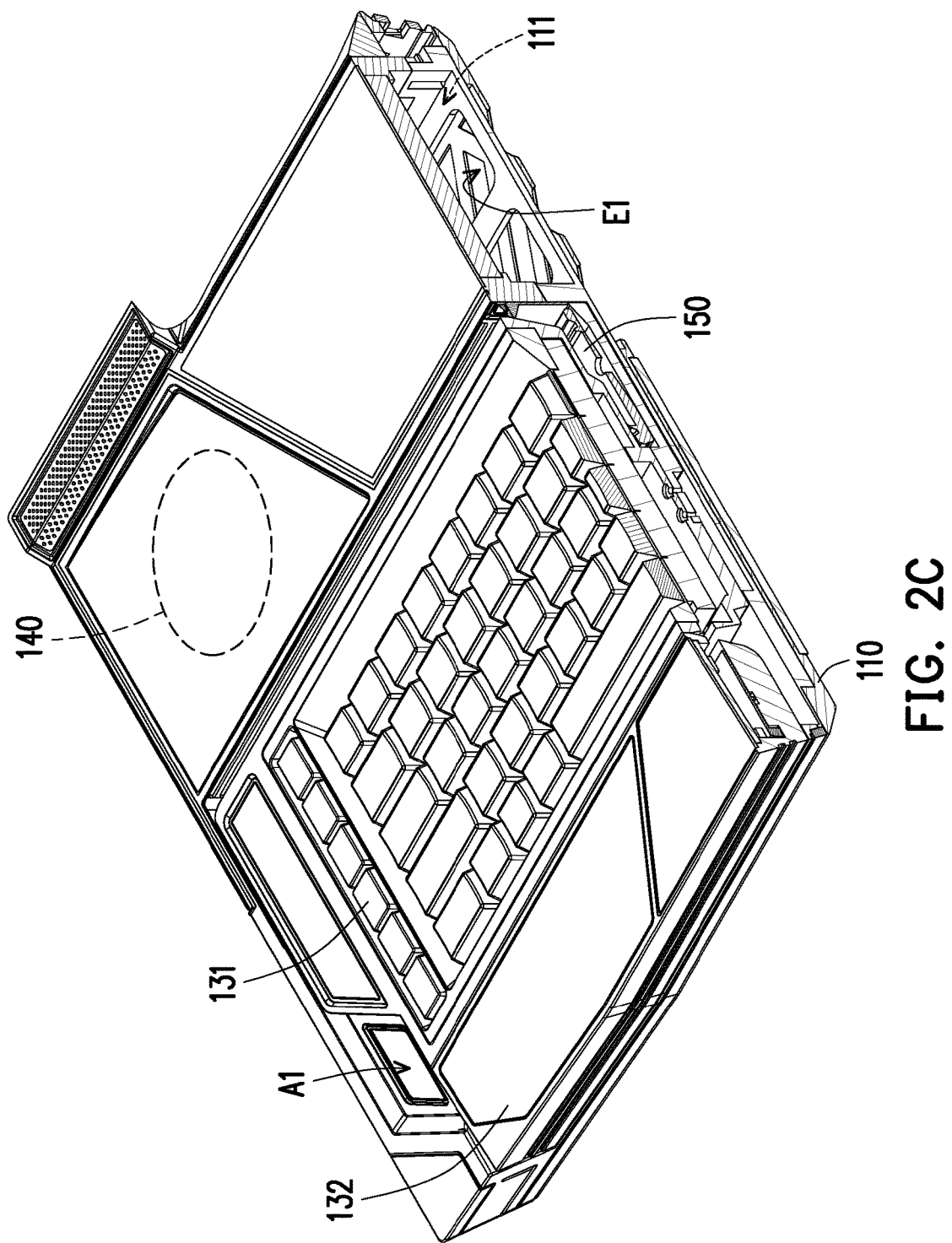
FIG. 2C and FIG. 2D are respectively schematic views showing another state of the laptop computer of FIG. 1.
Figure 2D:
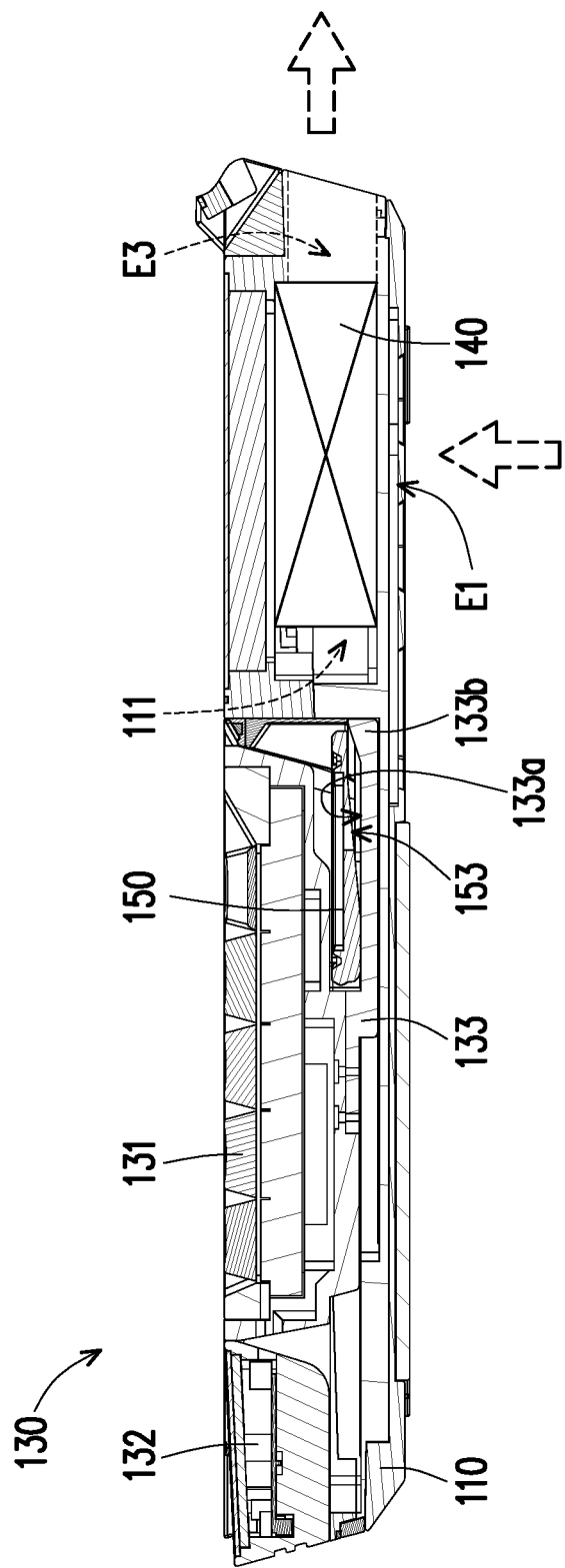

FIG. 2C and FIG. 2D are respectively schematic views showing another state of the laptop computer of FIG. 1. It can be known clearly from FIG. 2A to FIG. 2D, wherein FIG. 2A and FIG. 2B are shown as FIG. 1, the laptop computer 100 is in a state that the keyboard assembly 130 partially moves away from the first body 110 (which is defined as a second state), on another front, FIG. 2C and FIG. 2D show that the laptop computer 100 is in a state wherein the keyboard assembly 130 does not move away from the first body 110 (which is defined as a first state).

Further, please refer to FIG. 2A and FIG. 2C first. The keyboard assembly 130 includes a keypad portion 131 and a palm rest portion 132; multiple keys are disposed on the keypad portion 131 operated by the user, and the palm rest portion 132 is movably connected to the keypad portion 131. When the keyboard assembly 130 is in the first state shown as FIG. 2, the keyboard assembly 130 covers the first body 110 of the main body M1 and shelters the heat dissipation assembly 150 in the first body 110. When the keyboard assembly 130 is in the second state shown as FIG. 2A, a portion (the palm rest portion 132) of the keyboard assembly 130 protrudes out of the first body 110 of the main body M1 and form the second air inlet E2 to expose the lifted heat dissipation assembly 150 inside the first body 110. Thus, it can be clearly known that, in the first state, the keypad portion 131 and the palm rest portion 132 are both located on the first body 110 and are coplanar, and the heat dissipation assembly 150 is hidden in the first body 110 and is substantially parallel with the abovementioned keypad portion 131 and the palm rest portion 132. At the moment, the air of the environment flows into the receiving space 111, where the fan 140 is located, via the first air inlet E1 of the bottom of the first body 110, and flows out of the first body 110 via the air outlet E3 after the heat exchange being performed in the first body 110.

Comparatively, in the second state, as shown by FIG. 2A and FIG. 2B, the portion of the keyboard assembly 130 protrudes out of the first body 110; in other words, the palm rest portion 132 may move out of the first body 110 so as to droop opposite to the keypad portion 131 and lean upon a platform (not drawn) where the laptop computer 100 are placed on. Therefore, the palm rest portion 132 may be provided for the user to place the wrists to allow the user to operate the keypad portion 130 in an ergonomic way.

What is required to be explained is that the present embodiment does not limit the disposed location of the first air inlet. Please refer to FIG. 2B or FIG. 2D. In another embodiment that is not shown, the first air inlet may be disposed on a top of the first body 110, which is opposite to the first air inlet E1 in the embodiment above, or a plurality of the first air inlets E1 are formed at the top and the bottom relative to the fan 140 of the first body 110.

Figure 3A:
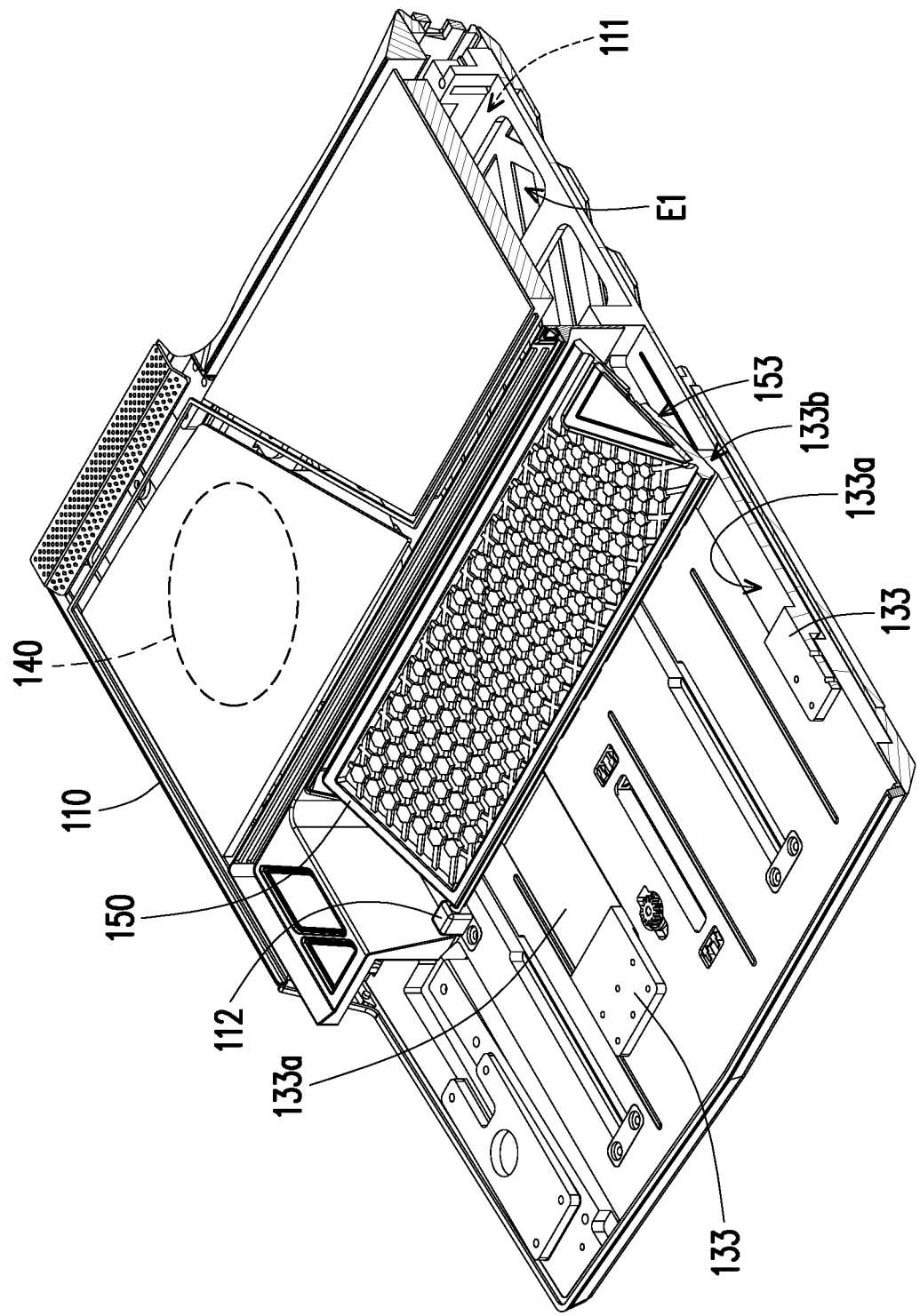
FIG. 3A and FIG. 3B are respectively schematic views of parts of components of the laptop computer.
Figure 3B:
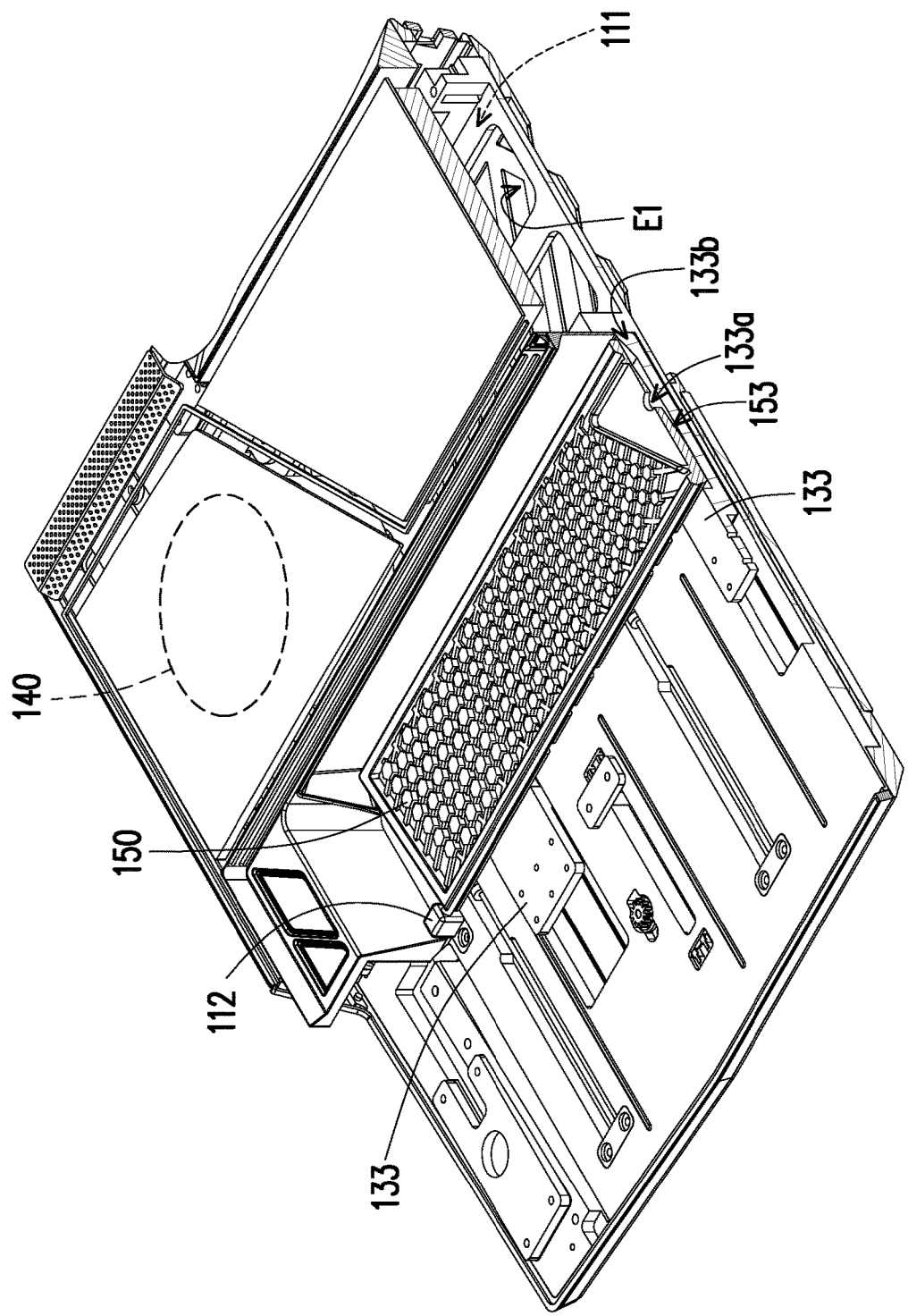
Figure 4A:
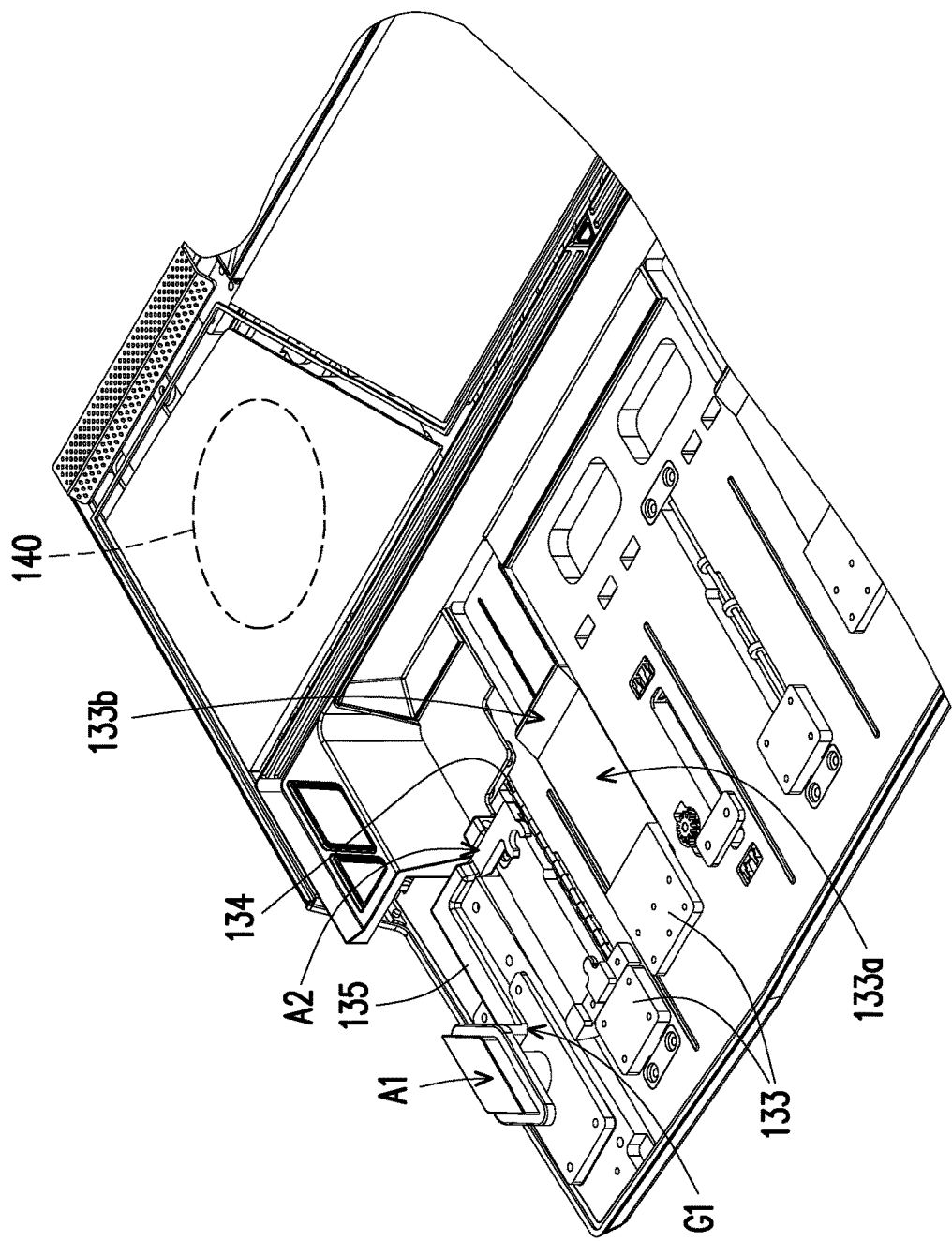
FIG. 4A to FIG. 4C are respectively schematic views of parts of components of the laptop computer.
Figure 4B:
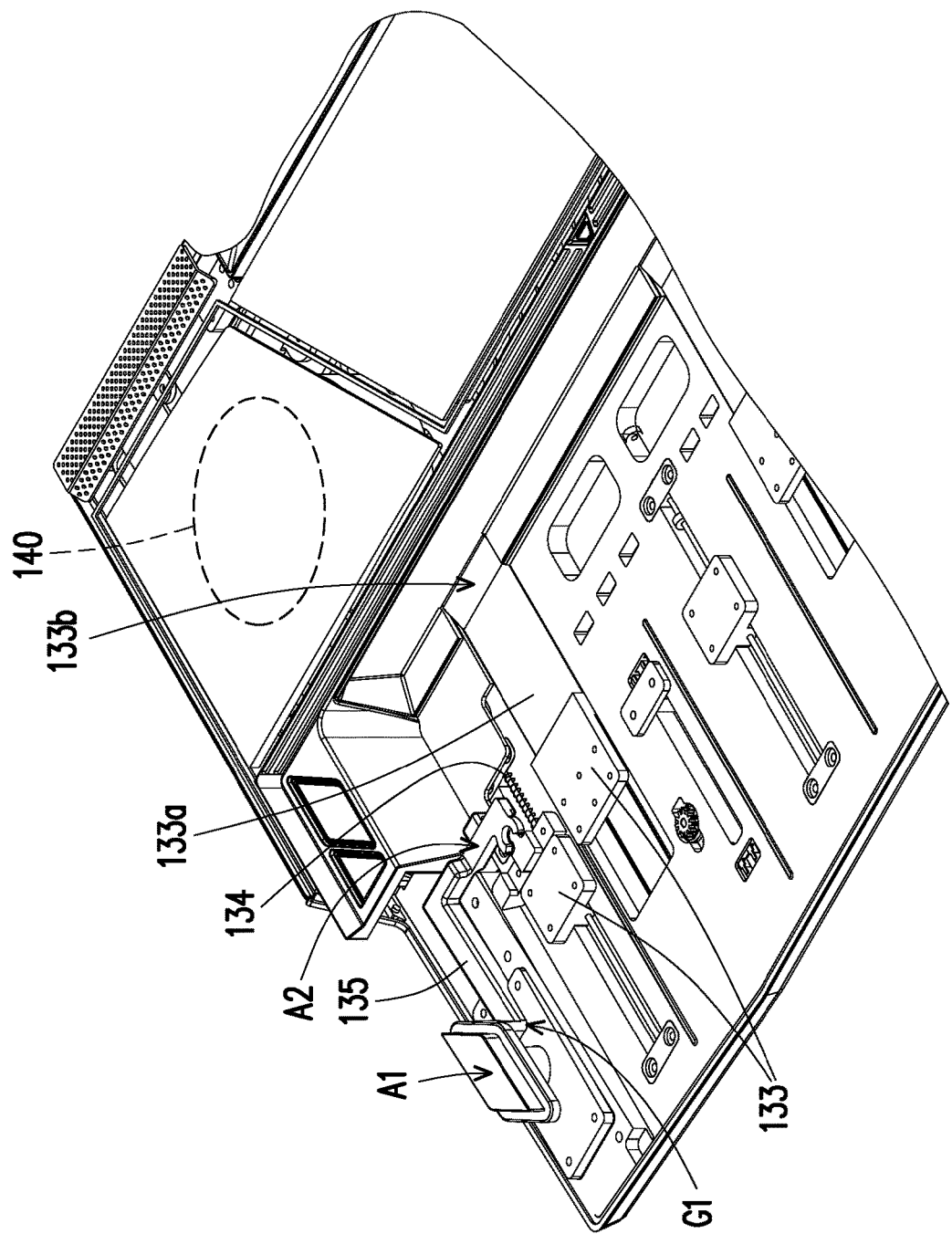
Figure 4C:
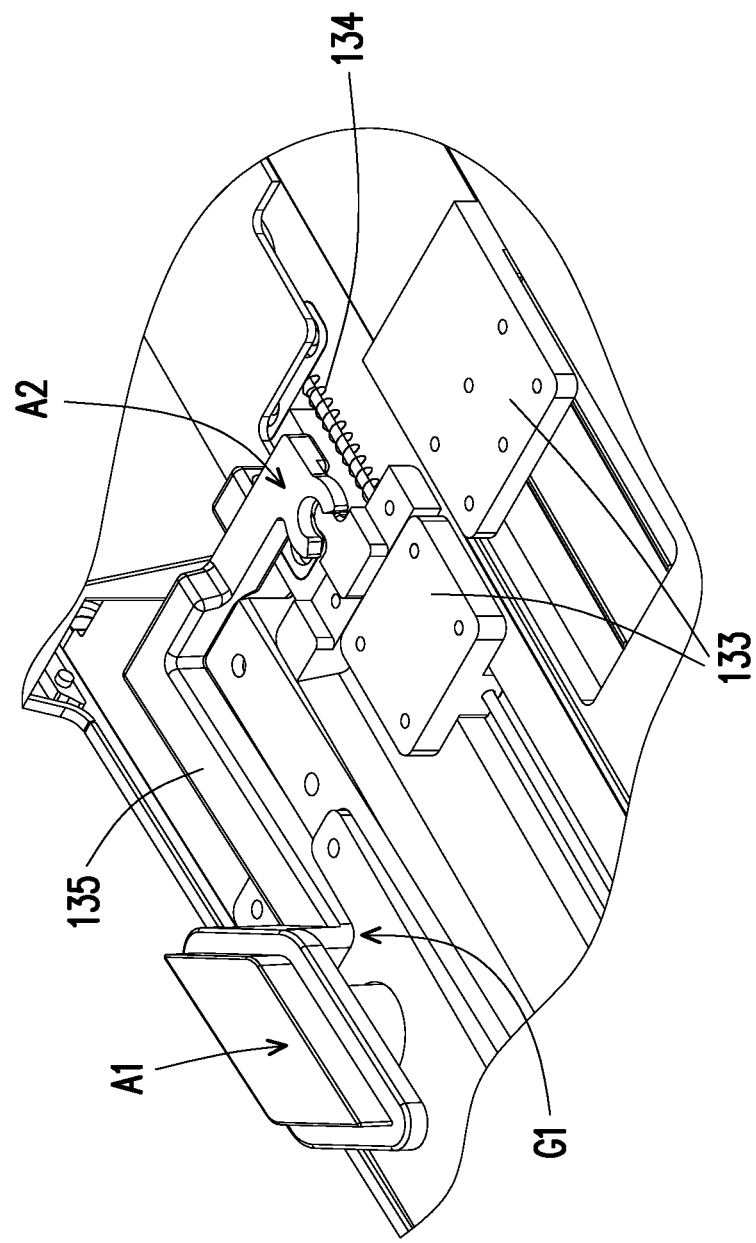

FIG. 3A and FIG. 3B are respectively schematic views of parts of components of the laptop computer. FIG. 4A to FIG. 4C are respectively schematic views of parts of components of the laptop computer. Please refer to FIG. 3B and FIG. 4B first. In the present embodiment, the keyboard assembly 130 further includes a sliding member 133, an elastic member 134 and a lever 135. The sliding member 133 is slidably disposed on an inner bottom of the first body 110, and the keypad portion 131 is substantially disposed on the sliding member 133 to slide along with the sliding member 133. The elastic member 134 is connected and abuts between the sliding member 133 and the main body M1 (the inner bottom of the first body 110). The lever 135 is movably disposed between the keypad portion 131 and the main body M1, wherein the pivot point G1 of the lever 135 leans against the inner bottom of the first body 110. A first end A1 is exposed out of the keypad portion 131, and a second end A2 opposite to the first end A1 is located in the main body M1 and buckles or releases the sliding member 133. Further, the second end A2 has a non-closed hole, and the sliding member 133 has a protruding portion, and the protruding portion is fitted to the non-closed hole. Therefore, as shown by FIG. 4B, in the first state, the protruding portion is fitted to and locked with the non-closed hole, and the elastic member 134 is pressed between the sliding member 133 and the main body M1 (the first body 110) to accumulate the elastic force. Further, as shown by FIG. 4C, the user presses the first end A1 to drive the non-closed hole of the second end A2 to move away from the protruding portion of the sliding member 133, the elastic force of the elastic member 134 drives the sliding member 133 and the keypad portion 131 on the main body M1 (the first body 110) to move, such that the keyboard assembly 130 is transformed to the second state as shown by FIG. 4A. The present embodiment does not limit the shape of the latch structure between the second end A2 and the sliding member 133. In another embodiment that is not shown, the non-closed hole may be disposed to the sliding member, so as to dispose the protruding portion on the second end, which may also achieve the same effect of being locked or releases mentioned above.

In addition, please refer to FIG. 4A and FIG. 2C. The first end A1 of the lever 135 shown by FIG. 4A may expose out of the keyboard assembly 130 in the first state to allow the user to press as shown by FIG. 2C. In the second state, the first end A1 of the lever 135 is sheltered by the keypad portion 131. When the user wants to restore the keyboard assembly 130 to the first state, the user may apply force onto the keyboard assembly 130 to push it back to its original position, wherein the lever 135 may be restored to the position of the first state due to the press of the keypad portion 131.

Please refer to FIG. 3A and FIG. 3B. Along with the sliding process of the keyboard assembly 130, the heat dissipation assembly 150 may be driven to change its state in the first body 110. In the present embodiment, the sliding member 133 has a receiving trough 133a extending toward the fan 140 and an abutting portion 133b located at an end of the receiving trough 133a. The heat dissipation assembly 150 is freely pivoted to the pivoting portion 112 of the first body 110 of the main body M1. In the first state, the heat dissipation assembly 150 is located in the receiving trough 133a. In the transforming process from the first state to the second state, the sliding member 133 moves, and the abutting portion 133b moves along an inclined surface 153 of the heat dissipation assembly 150 so as to push and lift up the heat dissipation assembly 150. In other words, referring to FIG. 2B and FIG. 2D, during the transforming process from the first state to the second state, the abutting portion 133b of the sliding member 133 gradually moves from a place near the fan 140 toward a pivoting (the pivoting portion 112) of the heat dissipation assembly 150 and the first body 110, and the abutting portion 133b is propped against and moves along the inclined surface 153 so as to lift up the heat dissipation assembly 150 in the second state, and the lifted heat dissipation assembly 150 is tilted relative to another portion (the keypad portion 131) of the keyboard assembly 130 still located on the main body M1 in the second state.

Please refer to FIG. 2A. In the present embodiment, the heat dissipation assembly 150 includes a plate 151. In the second state, the air of the environment outside the laptop computer 100 may be drawn by the fan 140 to flow into the receiving space 111 via the plate 151 and the second air inlet E2. Further, in addition to multiple openings 151a, a plurality of metal pieces 152 are disposed on the plate 151. Therefore, when the air of the environment flows through the plate 151, the multiple metal pieces 152 may cool down the air; in other words, before flowing into the receiving space 111, the air has therefore been cooled down in advance, and thus provide advantages to the effect of heat exchange in the receiving space 111.

The present embodiment does not limit the way that allows the plate 151 to achieve the cooling effect. In another embodiment that is not shown, a thermoelectric cooling chip may be disposed on the plate 151 to achieve the same effect of pre-cooling.

Figure 5A:
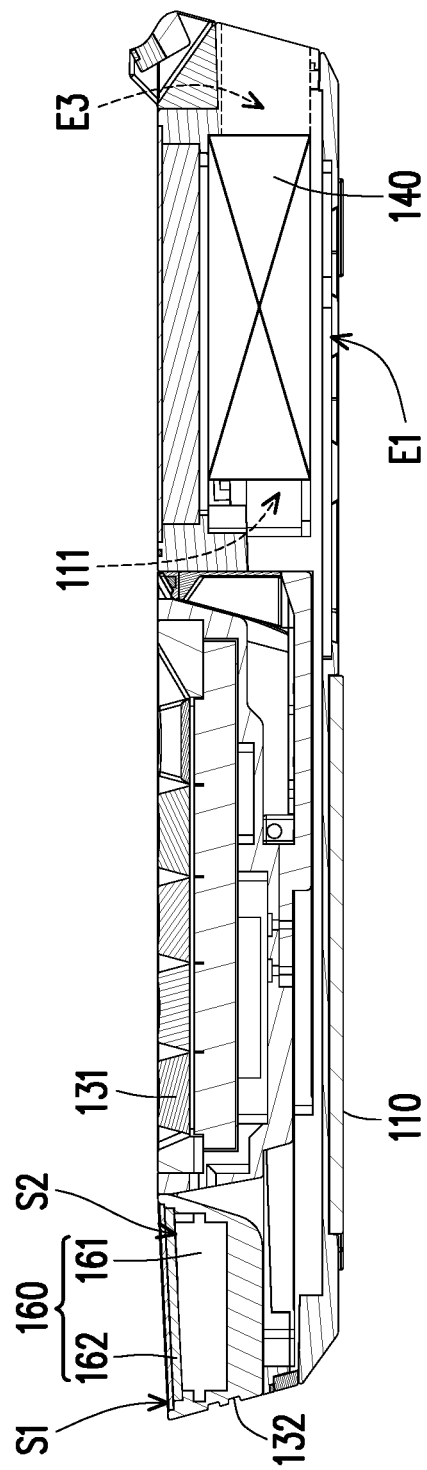
FIG. 5A and FIG. 5B are respectively sectional views of parts of components of the laptop computer.
Figure 5B:
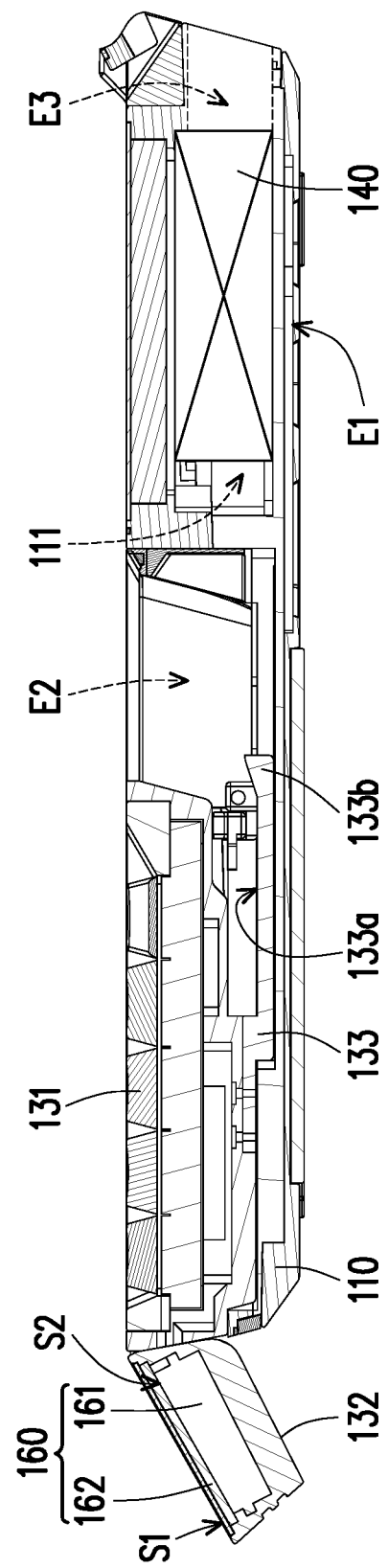

FIG. 5A and FIG. 5B are respectively sectional views of parts of components of the laptop computer. The keyboard assembly 130 is different from the sectional views of FIG. 2B and FIG. 2D mentioned above for a better recognition of the interior structure of the palm rest portion 132. The laptop computer 100 further includes a vibration source 160 and the palm rest portion 132 disposed to the keyboard assembly 130 to droop and lean upon the platform (not drawn) in the second state. In the present embodiment, the vibration source 160 includes a resonance speaker 161 and the audio output surface S2 of the resonance speaker 161 faces the surface S1 of the palm rest portion 132, and the surface S1 substantially faces away from the first body 110. Here, after the vibration source 160 is disposed to the palm rest portion 132, the palm rest portion 132 may provide the user with a sensory experience of vibration while providing voice to the user, so as to improve the operating experience of the user. Besides, the vibration source 160 of the present embodiment further includes a resonance medium 162 made of, for example, elastic materials, structurally abutting between the surface S1 of the palm rest portion 132 and the audio output surface S2 of the resonance speaker 161, to provide the resonance effect that can be generated by the resonance speaker 161 and to make the resonance expand to the whole surface of the palm rest portion 132, allowing the user to feel the vibration of sound wave when the user put their hands on any location of the palm rest portion 132.

Based on the above, in the abovementioned embodiments of the disclosure, the laptop computer allows the user to adjust the location of the keyboard assembly relative to the main body according his or her own requirement through the movable keyboard assembly design, wherein the palm rest portion moves to protrude out of the main body of the laptop computer and droop opposite to the keypad portion, so as to provide the user to lean the wrists to the tilted palm rest portion in a more comfortable position, and further allow the user to operate the keypad portion in a more ergonomics position. Meanwhile, the palm rest portion provides a further sensory experience to the user during the operation process through disposing the vibration source.

More importantly, the movable heat dissipation assembly is disposed in the main body and is linked to the keyboard assembly. Therefore, when the keyboard assembly moves on the main body, the heat dissipation assembly may be driven to be lifted up or descend. In its lifted state, the heat dissipation assembly may form an additional air inlet on the main body and cool down the air flowing through the heat dissipation assembly to cool down the air flowing into the receiving space, so as to increase the heat dissipation effect. Here, through disposing the metal pieces or the thermoelectric cooling chip on the plate with multiple openings, the heat dissipation assembly may provide an additional cooling effect to the air flowing through.

Although the disclosure has been disclosed in the above embodiments, the embodiments are not intended to limit the disclosure, and those skilled in the art may make some modifications and refinements without departing from the spirit and scope of the disclosure. Therefore, the scope of the disclosure is defined by the claims attached below.

What is claimed is:

1. A laptop computer, comprising:
   a main body;
   a fan, disposed in a receiving space of the main body, wherein the main body has at least one first air inlet and an air outlet communicating with the receiving space respectively, and the air of the environment outside the laptop computer is adapted to be drawn by the fan to flow into the receiving space via the first air inlet and flow out of the main body via the air outlet;
   a keyboard assembly, movably disposed on the main body; and
   a heat dissipation assembly, movably disposed in the main body and linked to the keyboard assembly,
   wherein when the keyboard assembly gradually moves out of the main body, the keyboard assembly drives the heat dissipation assembly to move in the main body to form a second air inlet on the main body, and the second air inlet communicates with the receiving space,
   wherein the air of the environment outside the laptop computer is adapted to be drawn by the fan to flow into the receiving space via the second air inlet and the heat dissipation assembly.

2. The laptop computer according to claim 1, wherein the main body comprises a first body and a second body, wherein the fan, the keyboard assembly and the heat dissipation assembly are disposed in the first body, and the second body is pivoted to the first body, and when the keyboard assembly gradually moves out of the main body, the keyboard assembly gradually moves away from the second body and forms the second air inlet on the first body.

3. The laptop computer according to claim 2, wherein the second body has a display screen.

4. The laptop computer according to claim 1, wherein the keyboard assembly is movably disposed on the main body to be transformed between a first state and a second state,
   wherein the keyboard assembly in the first state covers the main body and shelters the heat dissipation assembly, and in the second state, a portion of the keyboard assembly protrudes out of the main body to form the second air inlet and exposes the lifted heat dissipation assembly.

5. The laptop computer according to claim 4, wherein the keyboard assembly and the heat dissipation assembly are parallel with each other in the first state, and in the second state, the heat dissipation assembly is tilted relative to another portion of the keyboard assembly still located on the main body.

6. The laptop computer according to claim 4, wherein the keyboard assembly comprises:
   a keypad portion;
   a sliding member, slidably coupled to the main body, wherein the keypad portion is disposed on the sliding member;
   an elastic member, connected between the sliding member and the main body; and
   a lever, movably disposed between the keypad portion and the main body,
   wherein a first end of the lever is exposed out of the keypad portion, and a second end of the lever is located in the main body to buckle or release the sliding member,
   wherein the second end buckles the sliding member and the elastic member is pressed between the sliding member and the main body to accumulate an elastic force in the first state, the first end of the lever is adapted to be forced by a user to drive the second end to release the sliding member, and the elastic force of the elastic member drives the sliding member and the keypad portion to move on the main body to be transformed to the second state.

7. The laptop computer according to claim 6, wherein the second end has a non-closed hole or a protruding portion, the sliding member has a protruding portion or a non-closed hole, and the protruding portion is fitted to the non-closed hole.

8. The laptop computer according to claim 6, wherein the sliding member has a receiving trough extending toward the fan and an abutting portion located at an end of the receiving trough,
   wherein the heat dissipation assembly is freely pivoted to the main body, the heat dissipation assembly is located in the receiving trough,
   wherein the sliding member moves in a transforming process from the first state to the second state, such that the abutting portion moves along an inclined surface of the heat dissipation assembly to push and lift up the heat dissipation assembly.

9. The laptop computer according to claim 4, wherein the keyboard assembly comprises a keypad portion and a palm rest portion; the palm rest portion is movably connected to the keypad portion,
   wherein the keypad portion and the palm rest portion are both located on the main body and are coplanar in the first state,
   wherein the keypad portion is located on the main body, and the palm rest portion protrudes out of the main body and droops opposite to the keypad portion in the second state.

10. The laptop computer according to claim 4, further comprising:
    a vibration source, disposed in the palm rest portion.

11. The laptop computer according to claim 10, wherein the palm rest portion has a surface facing away from the main body, and the vibration source comprises a resonance speaker having an audio output surface facing toward the surface.

12. The laptop computer according to claim 11, wherein the vibration source further comprises a resonance medium structurally abutting between the surface and the audio output surface of the resonance speaker.

13. The laptop computer according to claim 1, wherein the heat dissipation assembly is a cooling member to cool down the air flowing through.

14. The laptop computer according to claim 1, wherein the heat dissipation assembly comprises a plate with multiple openings, and the air of the environment outside the laptop computer flows into the receiving space via the plate and the second air inlet.

15. The laptop computer according to claim 14, wherein the heat dissipation assembly further comprises a plurality of metal pieces disposed on the plate to cool down the air flowing through the plate.

16. The laptop computer according to claim 14, wherein the heat dissipation assembly further comprises a thermoelectric cooling chip disposed on the plate to cool down the air flowing through the plate.

* * * * *